(12) United States Patent
Kinoshita et al.

(10) Patent No.: US 7,777,270 B2
(45) Date of Patent: Aug. 17, 2010

(54) NONVOLATILE SEMICONDUCTOR MEMORY DEVICE AND METHOD FOR MANUFACTURING THE SAME

(75) Inventors: Atsuhiro Kinoshita, Kamakura (JP); Hiroshi Watanabe, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 11/835,694

(22) Filed: Aug. 8, 2007

(65) Prior Publication Data

US 2008/0111178 A1 May 15, 2008

(30) Foreign Application Priority Data

Aug. 28, 2006 (JP) .............................. 2006-231073

(51) Int. Cl.
*H01L 29/788* (2006.01)
(52) U.S. Cl. .................................. 257/316; 257/E29.3
(58) Field of Classification Search .................. 257/316
See application file for complete search history.

(56) References Cited

U.S. PATENT DOCUMENTS

| | | | | |
|---|---|---|---|---|
| 6,115,287 A * | 9/2000 | Shimizu et al. | ......... | 365/185.17 |
| 7,393,748 B2 * | 7/2008 | Arai et al. | .................... | 438/258 |
| 2004/0129979 A1 * | 7/2004 | Park et al. | .................... | 257/350 |
| 2004/0132259 A1 * | 7/2004 | Yang et al. | .................... | 438/305 |
| 2005/0212055 A1 * | 9/2005 | Nakabayashi et al. | ....... | 257/369 |
| 2008/0128780 A1 * | 6/2008 | Nishihara et al. | ........... | 257/316 |
| 2008/0157092 A1 * | 7/2008 | Arai et al. | ..................... | 257/67 |
| 2008/0173916 A1 * | 7/2008 | Nishihara | ................... | 257/298 |
| 2009/0014828 A1 * | 1/2009 | Mizushima et al. | ......... | 257/506 |

FOREIGN PATENT DOCUMENTS

| | | |
|---|---|---|
| JP | 11-87545 | 3/1999 |
| JP | 2000-174241 | 6/2000 |
| JP | 2001-326289 | 11/2001 |
| JP | 2006-24930 | 1/2006 |
| KR | 2003-20644 | 3/2003 |
| KR | 2005-22624 | 3/2005 |

OTHER PUBLICATIONS

U.S. Appl. No. 11/963,046, filed Dec. 21, 2007, Arai, et al.

\* cited by examiner

*Primary Examiner*—Benjamin P Sandvik
(74) *Attorney, Agent, or Firm*—Oblon, Spivak, McClelland, Maier & Neustadt, L.L.P.

(57) ABSTRACT

It is made possible to provide a memory device that can be made very small in size and have a high capacity while being able to effectively suppress short-channel effects. A nonvolatile semiconductor memory device includes: a first insulating film formed on a semiconductor substrate; a semiconductor layer formed above the semiconductor substrate so that the first insulating film is interposed between the semiconductor layer and the semiconductor substrate; a NAND cell having a plurality of memory cell transistors connected in series, each of the memory cell transistors having a gate insulating film formed on the semiconductor layer, a floating gate formed on the gate insulating film, a second insulating film formed on the floating gate, and a control gate formed on the second insulating film; a source region having an impurity diffusion layer formed in one side of the NAND cell; and a drain region having a metal electrode formed in the other side of the NAND cell.

14 Claims, 12 Drawing Sheets

NONVOLATILE SEMICONDUCTOR MEMORY DEVICE AND METHOD FOR MANUFACTURING THE SAME

CROSS-REFERENCE TO RELATED APPLICATION

This application is based upon and claims the benefit of priority from prior Japanese Patent Application No. 2006-231073 filed on Aug. 28, 2006 in Japan, the entire contents of which are incorporated herein by reference.

BACKGROUND OF THE INVENTION

1. Field of the Invention

The present invention relates to a nonvolatile semiconductor memory device that includes memory cells that are memory transistors each having a charge storing layer and a control gate, and a method for manufacturing such a nonvolatile semiconductor memory device.

2. Related Art

As the memory cells for electrically rewritable nonvolatile semiconductor memory devices (EEPROM), there have been known memory cells called NAND flash memories each having a MOS transistor structure that includes a charge storing layer and a control gate in its gate unit, and injects charges into the charge storing layer and releases charges from the charge storing layer with the use of a tunnel current. In each of those memory cells, threshold voltages representing different charge storing states of the charge storing layer are stored as the data "0" and "1". For example, to inject electrons into a floating gate that is the charge storing layer, the substrate is grounded, and a positive high voltage is applied to the control gate. Electrons are then injected into the floating gate from the substrate side, by virtue of the tunnel current. As a result of the electron injection, the threshold voltage of the memory cell shifts in the positive direction. To release electrons from the floating gate, the control gate is grounded, and a positive high voltage is applied to the source/drain diffusion layer or the substrate. Electrons are then released from the floating gate toward the substrate, by virtue of the tunnel current. As a result of the electron release, the threshold voltage of the memory cell shifts in the negative direction.

However, in today's highly sophisticated information society and in the trend of rapid digitalization, those nonvolatile semiconductor memory devices have been rapidly becoming minute and have higher capacities. As the nonvolatile semiconductor memory devices become minute, more problems arise, such as short-channel effects, intercell interference effects, and difficulties in manufacturing. As a result, the product development is becoming more and more difficult. Particularly, short-channel effects are one of the biggest problems, causing deterioration in ON/OFF ratio and degrading the performance of each memory. Therefore, memory cells that have fully-depleted (FD) channel structures resistant to short-channel effects have been suggested (see JP-A 2000-174241 (KOKAI), for example).

If a structure becomes as small as where the distance between each two cells is 32 nm or less, it is technically difficult to form a source and drain between the cells.

SUMMARY OF THE INVENTION

The present invention has been made in view of these circumstances, and an object thereof is to provide a nonvolatile semiconductor memory device that can be made very small in size and have a high capacity while being able to effectively suppress short-channel effects, and a method for manufacturing the nonvolatile semiconductor memory device.

A nonvolatile semiconductor memory device according to a first aspect of the present invention includes: a first insulating film formed on a semiconductor substrate; a semiconductor layer formed above the semiconductor substrate so that the first insulating film is interposed between the semiconductor layer and the semiconductor substrate; a NAND cell having a plurality of memory cell transistors connected in series, each of the memory cell transistors having a gate insulating film formed on the semiconductor layer, a floating gate formed on the gate insulating film, a second insulating film formed on the floating gate, and a control gate formed on the second insulating film; a source region having an impurity diffusion layer formed in one side of the NAND cell; and a drain region having a metal electrode formed in the other side of the NAND cell.

A nonvolatile semiconductor memory device according to a second aspect of the present invention includes: a first insulating film formed on a semiconductor substrate; a semiconductor layer formed above the semiconductor substrate so that the first insulating film is interposed between the semiconductor layer and the semiconductor substrate; a NAND cell having a plurality of memory cell transistors connected in series, each of the memory cell transistors having a gate insulating film formed on the semiconductor layer, a control gate formed on the gate insulating film, and a floating gate formed in the first insulating film so as to face the control gate; a common control gate formed between the semiconductor substrate and the first insulating film so as to face the NAND cell; a source region formed in one side of the NAND cell; and a drain region formed in the other side of the NAND cell.

A method for manufacturing a nonvolatile semiconductor memory device according to a third aspect of the present invention includes: forming a first insulating film on a first face of a semiconductor substrate; forming a plurality of floating gates on the first insulating film; forming a second insulating film so as to cover the plurality of floating gates; forming a common control gate on the second insulating film; forming a first semiconductor layer so as to cover the common control gate; and forming a second semiconductor layer by flipping the semiconductor substrate upside down and flattening a second face of the semiconductor substrate opposite from the first face.

DETAILED DESCRIPTION OF THE INVENTION

Hereinafter, embodiments of the present invention will be described below with reference to the accompanying drawings. It should be noted that the present invention is not limited to those embodiments. In the following embodiments, the components of each p-type semiconductor may be replaced with the components of an n-type semiconductor, and the components of each n-type semiconductor may be replaced with the components of a p-type semiconductor.

First Embodiment

A nonvolatile semiconductor memory device in accordance with a first embodiment of the present invention is a NAND flash memory of a fully depleted type. FIG. 2 is a circuit diagram of the nonvolatile semiconductor memory device, and FIG. 1 is a cross-sectional view of the memory cell array in the bit-line direction.

As shown in FIG. 2, in the fully-depleted NAND flash memory of this embodiment, NAND cell units are arranged in a matrix form. Each of the NAND cell units includes a NAND cell 10 formed with memory cells $M_1$, $M_2$, $M_3$, $M_4$, and $M_5$ connected in series, and two select gate transistors $S_S$ and $S_D$ arranged at either end of the NAND cell 10. A word line $WL_i$ is connected to the gate of each memory cell $M_i$ (i=1, 2, ..., 5). One end of the select gate transistor $S_S$ is connected to one end of the NAND cell 10, and the other end of the select gate transistor $S_S$ is connected to a source line SL. A source line select signal SGS is applied to the gate of the select gate transistor $S_S$. One end of the select gate transistor $S_D$ is connected to the other end of the NAND cell 10, and the other end of the select gate transistor $S_D$ is connected to a bit line (a bit line $BL_1$, for example). A bit line select signal SGD is applied to the gate of the select gate transistor $S_D$. Each word line $WL_i$ (i=1, 2, ..., 5) is connected to a row decoder 100, and the source bit select signal SGS and the bit line select signal SGD are transmitted from the row decoder 100. In the fully-depleted NAND flash memory of this embodiment, two NAND cell units share one bit line and one source line.

Figure 1:
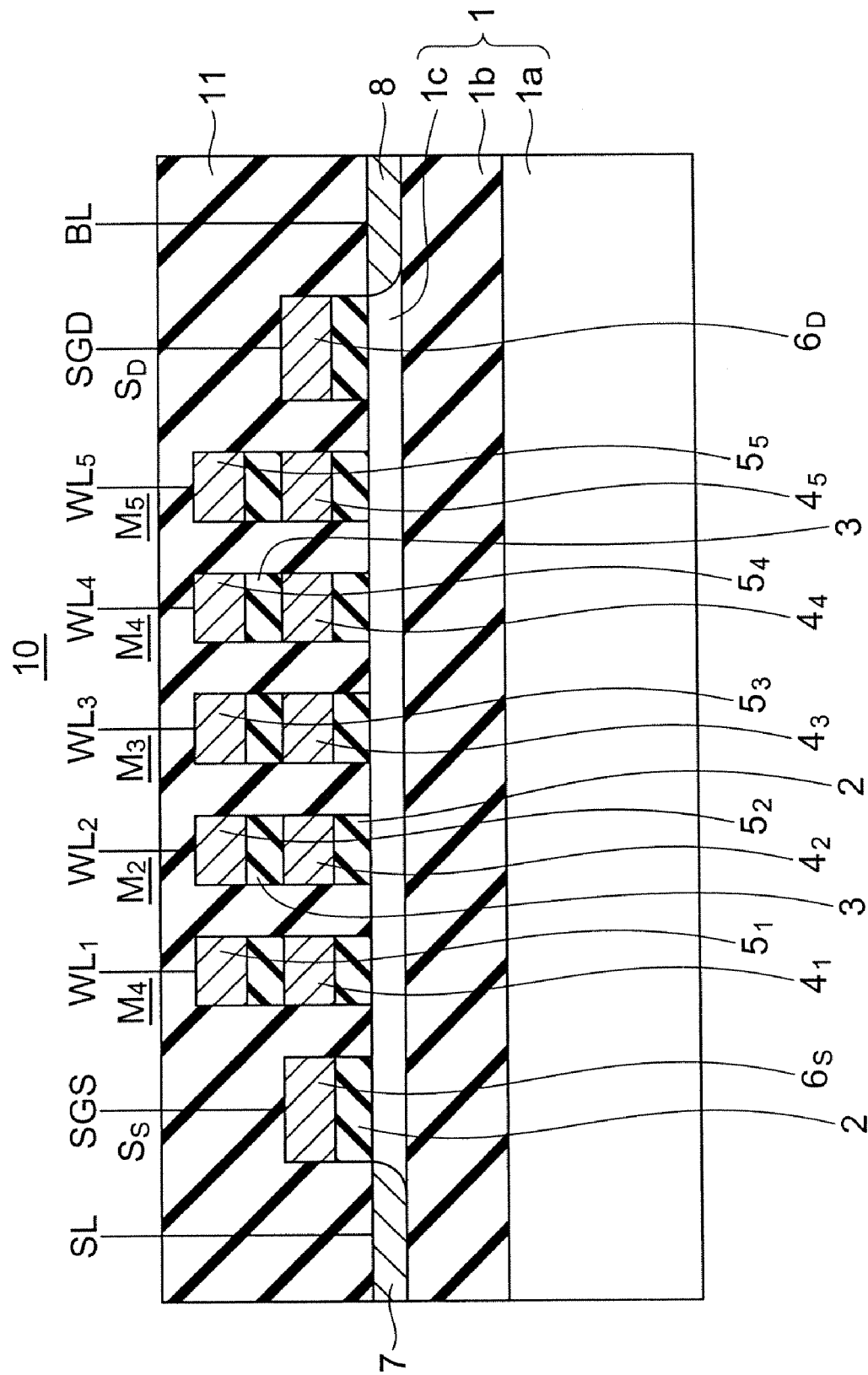
FIG. 1 is a cross-sectional view of a nonvolatile semiconductor memory device in accordance with a first embodiment of the present invention.
Figure 2:
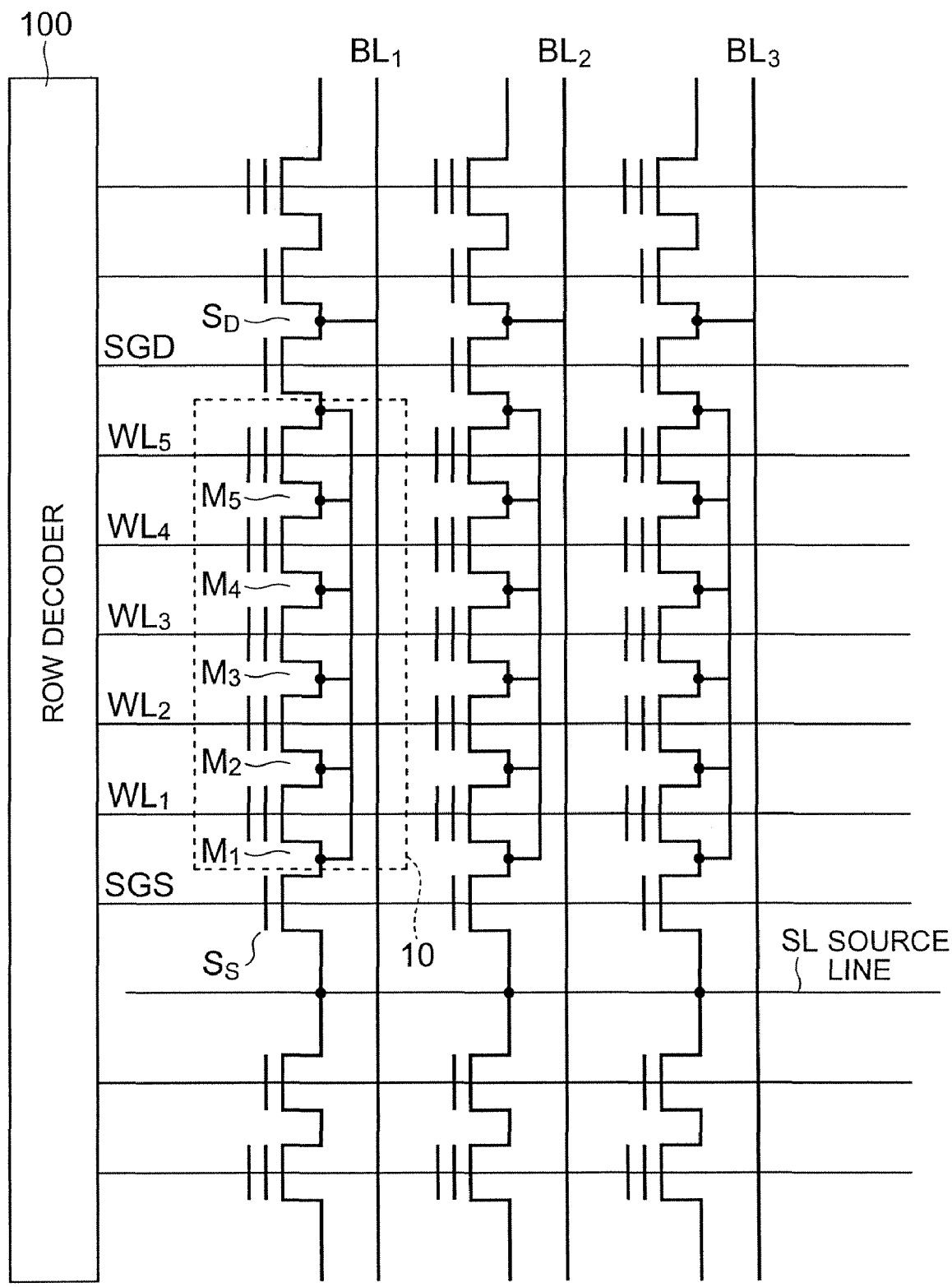
FIG. 2 is a circuit diagram of the nonvolatile semiconductor memory device in accordance with the first embodiment.

Also, as shown in FIG. 1, the fully-depleted NAND flash memory of this embodiment is formed on a SOI substrate 1 that includes a support substrate 1a, a buried oxide film 1b formed on the support substrate 1a, and a SOI layer 1c formed on the buried oxide film 1b. The NAND cell 10 and the select gate transistors $S_S$ and $S_D$ of each NAND cell unit are formed, so that the floating gate $4_i$ of each memory cell $M_i$ (i=1, 2, ..., 5) and the gates $6_S$ and $6_D$ of the select gate transistors $S_S$ and $S_D$ are formed on the SOI layer 1c that serves as a common channel region, and a gate insulating film 2 formed on the SOI layer 1c is interposed between the SOI layer 1c and each floating gate $4_i$ and the gates $6_S$ and $6_D$. A control gate $5_i$ is formed on each floating gate $4_i$ (i=1, 2, ..., 5), so that an insulating film 3 formed on each floating gate $4_i$ is interposed between the floating gate $4_i$ and the control gate $5_i$. In each NAND cell unit, a source region 7 that is formed with an $n^+$-type impurity diffusion layer and is connected to a source line SL is provided on the opposite side of the select gate transistor $S_S$ from the side connected to the NAND cell 10 in the area of the SOI layer 1c. A drain region 8 that is formed with a metal electrode and is connected to a bit line BL is formed on the opposite side of the select gate transistor $S_D$ from the side connected to the NAND cell 10 in the area of the SOI layer 1c. Accordingly, each NAND cell unit includes a NAND cell 10, select gate transistors $S_S$ and $S_D$ formed at either end of the NAND cell 10, a source region 7 formed with an $n^+$-type impurity diffusion layer, and a drain region 8 formed with a metal electrode. The NAND cell units are covered with an interlayer insulating film 11.

In this embodiment, a write operation and an erase operation are performed in the following manner.

In a write operation, the source region 7 and the drain region 8 are grounded, and a positive bias is applied to the gates $6_S$ and $6_D$ of the select gate transistors $S_S$ and $S_D$ and the control gate $5_i$ of each memory cell $M_i$ (i=1, 2, ..., 5), so as to form an n-type inversion layer in the SOI layer 1c that serves as the common channel region. A large positive bias is then applied to the memory cell (the memory cell $M_1$, for example) on which writing is to be performed, and electrons are injected to the floating gate $4_1$. Here, a negative bias may be applied to the control gates $5_2$, $5_3$, $5_4$, and $5_5$ of the memory cells $M_2$, $M_3$, $M_4$, and $M_5$ on which writing is not to be performed.

In an erase operation, the drain region 8 is grounded, and a negative bias is applied to the gates $6_S$ and $6_D$ of the select gate transistors $S_S$ and $S_D$ and the control gate $5_i$ of each memory cell $M_i$ (i=1, 2, ..., 5), so as to form a p-type inversion layer in the SOI layer 1c that serves as the common channel region. A large negative bias is then applied to the control gate of the memory cell (the control gate $5_5$ of the memory cell $M_5$, for example) on which erasing is to be performed, and holes are injected to the floating gate $4_5$. Here, a positive bias may be applied to the control gates $5_1$, $5_2$, $5_3$, and $5_4$ of the memory cells $M_1$, $M_2$, $M_3$, and $M_4$ on which erasing is not to be performed.

In a reading operation, the source region 7 is grounded, and a positive bias is applied to the drain region 8, as in a regular NAND flash memory. A positive bias is then applied to the control gates of the memory cells (the control gate $5_1$, $5_2$, $5_4$, and $5_5$ of the memory cell $M_1$, $M_2$, $M_4$, and $M_5$, for example) other than the control gate of the memory cell (the memory cell $M_3$, for example) from which information is to be read. The information "0" or "1" is read out, based on whether a current flows through the control gate.

In the above described operations, this embodiment is characterized in that holes can be generated in the channel region during an erasing operation, with the use of the drain region 8 formed with a metal electrode. With this arrangement, it is not necessary to use stored charges. Accordingly, a channel structure of a fully depleted type can be employed, and a memory that short-channel effects is effectively suppressed can be provided.

To simply generate holes in the channel, it seems that a drain region formed with a p-type impurity diffusion layer, instead of a drain region formed with a metal electrode, should fulfill the purpose. However, in a reading operation with this structure, the memory cells $M_i$ (i=1, 2, ..., 5) act as diodes having gates, and accurate reading cannot be performed.

Further, in a case where the source region and the drain region are both formed with metal electrodes, writing and erasing can be performed in the same manner as in this embodiment, but the very high source resistance caused by a Schottky barrier reduces the current flowing during a reading operation to a very low current. As a result, accurate reading cannot be performed. In the drain region, such a Schottky barrier does not become a problem, and the above described problem is not caused in the drain region of this embodiment.

For the above reasons, an $n^+$-type impurity diffusion layer is used for the source region, and a metal electrode is used for the drain region in this embodiment.

Also, in this embodiment, one source region 7 formed with an $n^+$-type impurity diffusion layer and one drain region 8 formed with a metal electrode are provided in each NAND cell unit. Accordingly, the distance between each two memory cells can be made as short as possible, and a minute and high-capacity memory device can be produced.

Second Embodiment

In the first embodiment, the memory cells and the select gate transistors are formed on a SOI substrate. In a case where ultrafine memory cells are employed, the gate length of each individual memory cell is normally 30 nm or less. Therefore, to effectively suppress short-channel effects, the film thickness of the SOI layer 1c should be ½ to ¼ of the gate length of each memory cell or smaller. In such a case, the ON resistance of the select gate transistors $S_S$ and $S_D$ might hinder device operations. To lower the ON resistance, the gate length of each of the select gate transistors $S_S$ and $S_D$ needs to be shortened. However, even when a large bias is applied to the memory cells in a writing or erasing operation, the select gate transistors $S_S$ and $S_D$ need to be in an ON or OFF state. Therefore, the gate lengths of the select gate transistors $S_S$ and $S_D$ cannot be made short in reality.

The most problematic resistance of the select gate transistors $S_S$ and $S_D$ of the first embodiment is a parasitic resistance in the source/drain regions. The parasitic resistance is caused, because the film thickness of the SOI layer 1c is very small. Accordingly, to solve those problems, only the select gate transistors should be formed on a bulk substrate, and only the memory cell region is formed on a SOI substrate.

Figure 3:
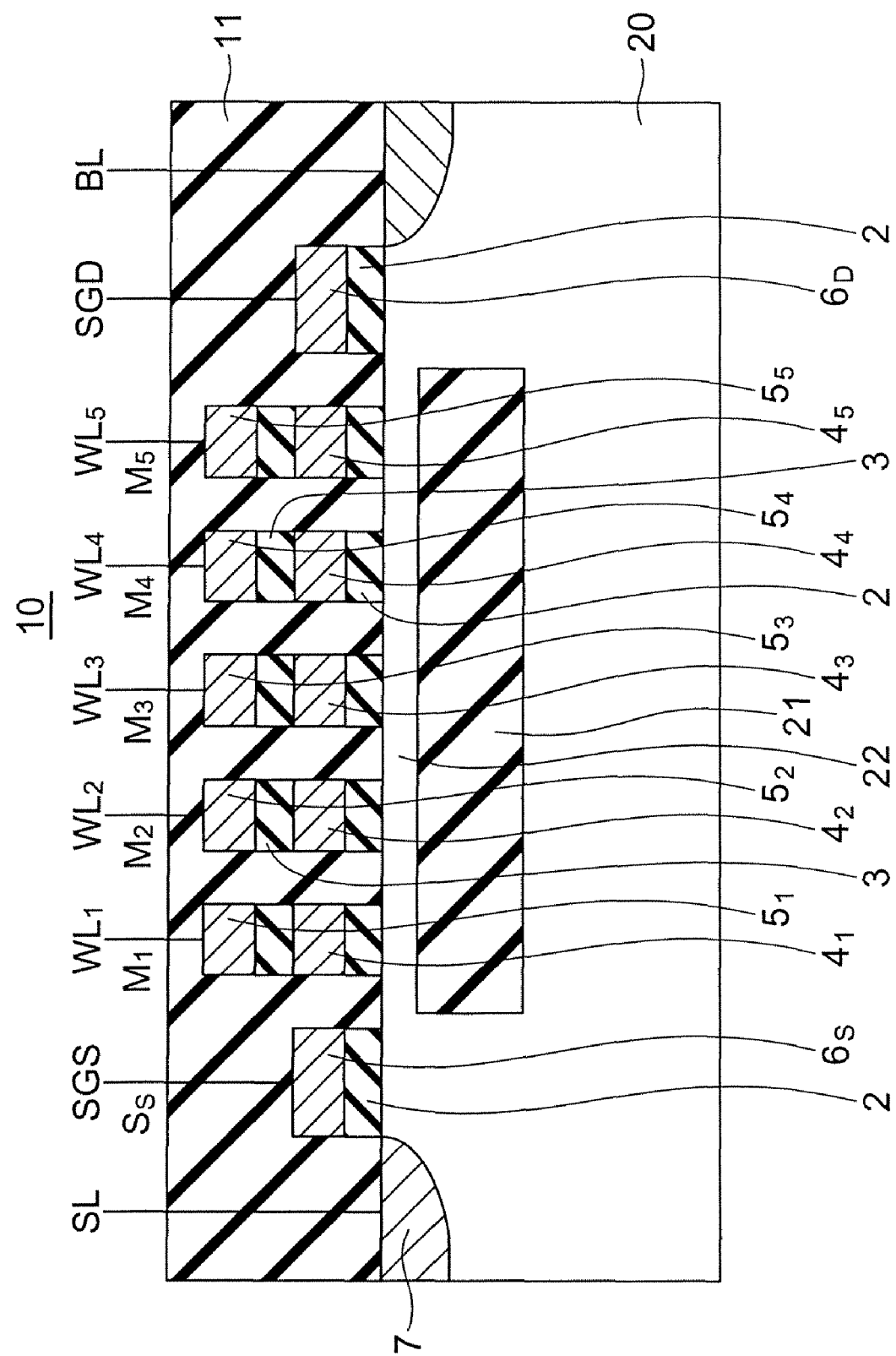
FIG. 3 is a cross-sectional view of the nonvolatile semiconductor memory device in accordance with a second embodiment.

A fully-depleted NAND flash memory that is formed in the above described manner is a semiconductor memory device of the second embodiment of the present invention. As shown in FIG. 3, in the fully-depleted NAND flash memory of the second embodiment, the floating gate $4_i$ of each memory cell $M_i$ (i=1, 2, . . . , 5) is formed so that a semiconductor layer 22 formed on a buried insulating film 21 formed in a bulk substrate 20 and the gate insulating films 2 formed on the semiconductor layer 22 are interposed between the floating gates $4_i$ and the buried insulating film 21. The select gate transistors $S_S$ and $S_D$ are formed on the bulk substrate 20, so that the gate insulating films 2 are interposed between the select gate transistors $S_S$ and $S_D$ and the bulk substrate 20.

With this structure of this embodiment, short-channel effects can be more effectively suppressed than in the first embodiment, and the ON resistance of the select gate transistors can be more effectively lowered than in the first embodiment. Like the first embodiment, this embodiment can provide a memory device that can be made very small in size and have a high capacity while being able to effectively suppress short-channel effects.

As in this embodiment, there are various methods for partially producing a SOI structure. For example, portions that are not to be turned into SOI portions are masked by a known lithography technique, and oxygen ion implantation is performed with a dose amount of $3 \times 10^{17}$ cm$^{-2}$ at an acceleration voltage of approximately 150 keV. After that, the mask is removed, and a known SIMOX (Separation by Implanted Oxygen) method is implemented by performing annealing at approximately 525° C.

Third Embodiment

Figure 4:
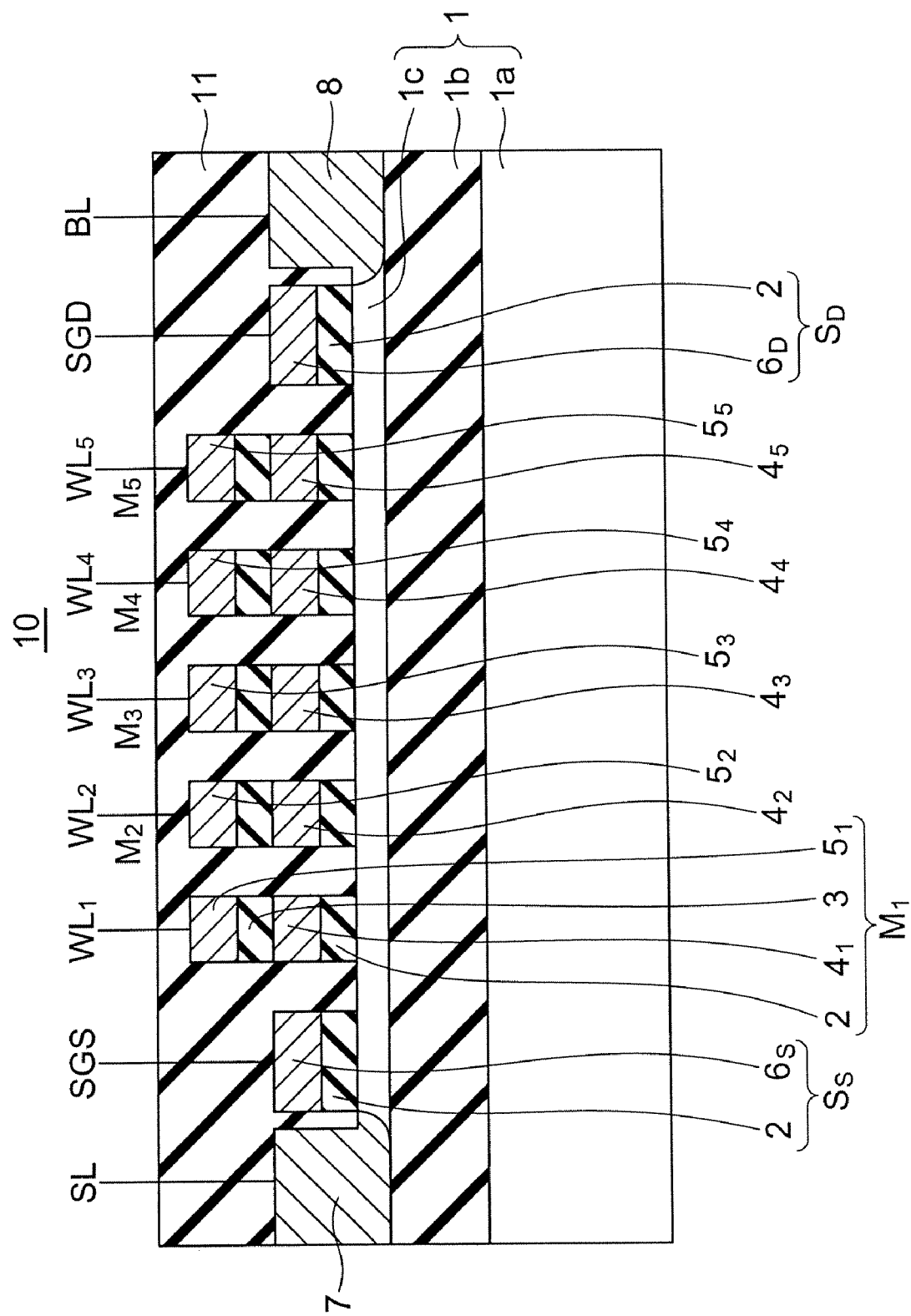
FIG. 4 is a cross-sectional view of the nonvolatile semiconductor memory device in accordance with a third embodiment.

Next, a nonvolatile semiconductor memory device in accordance with a third embodiment of the present invention is described. The nonvolatile semiconductor memory device of this embodiment is a NAND flash memory of a fully depleted type. FIG. 4 is a cross-sectional view of the nonvolatile semiconductor memory device of this embodiment. Like the fully-depleted NAND flash memory of the second embodiment, the fully-depleted NAND flash memory of this embodiment efficiently reduces the source/drain parasitic resistance of the select gate transistors.

The fully-depleted NAND flash memory of this embodiment is the same as the fully-depleted NAND flash memory of the first embodiment shown in FIG. 1, except that only the source region 7 and the drain region 8 are lifted up. More specifically, the upper faces of the source region 7 and the drain region 8 are located closer to the respective gate insulating films 2 than to the interface between the SOI layer 1c and each gate insulating film 2. The height of the upper faces should preferably be twice or more the thickness of the SOI layer 1c. This structure can be obtained by growing Si or Ge only on the source region 7 and the drain region 8 by the selective epitaxial growth technique, after the structure of the first embodiment is produced.

This embodiment can achieve the same effects as the second embodiment.

Fourth Embodiment

Figure 5:
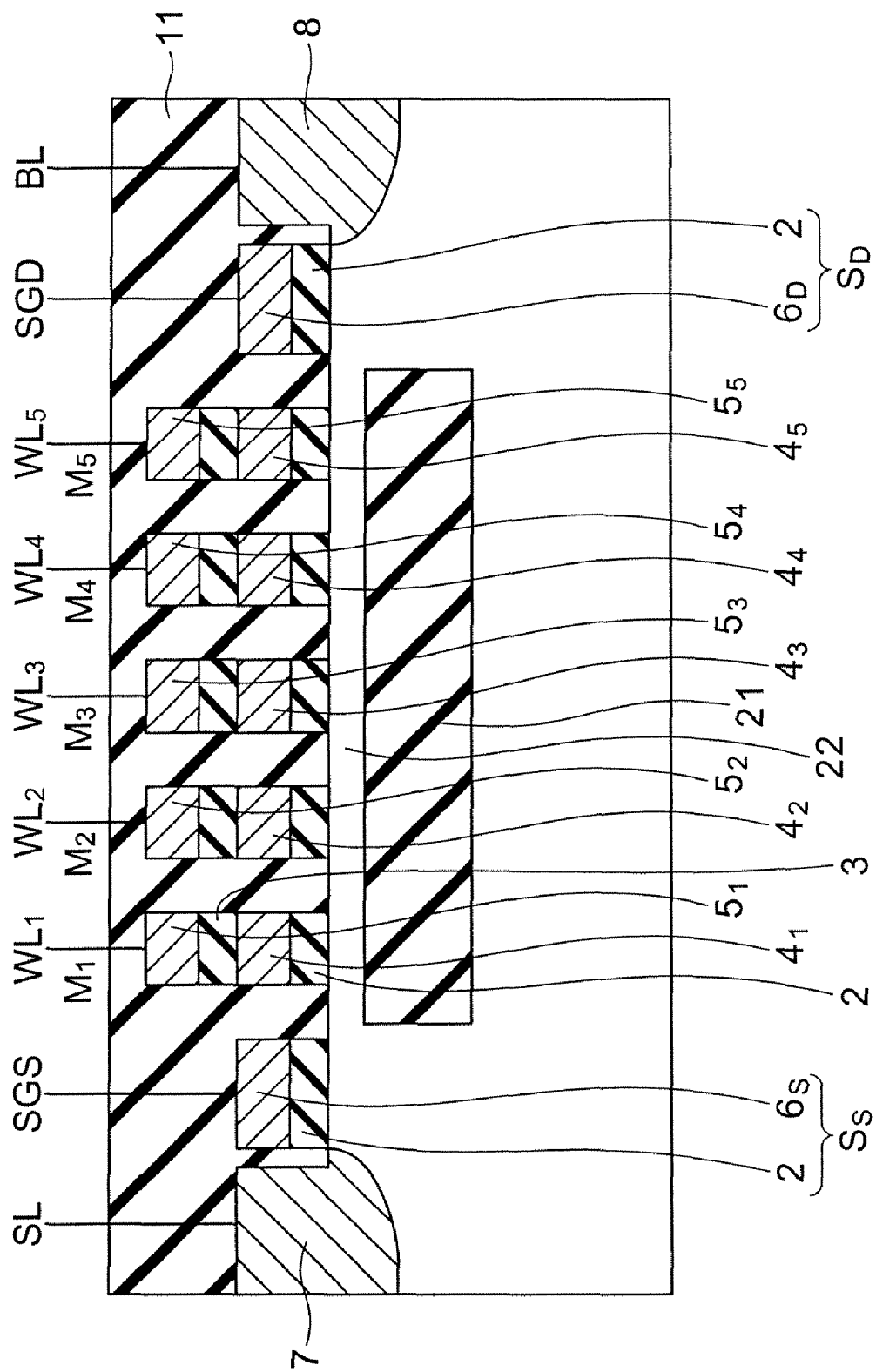
FIG. 5 is a cross-sectional view of the nonvolatile semiconductor memory device in accordance with a fourth embodiment.

Next, a nonvolatile semiconductor memory device in accordance with a fourth embodiment of the present invention is a NAND flash memory of a fully depleted type. FIG. 5 is a cross-sectional view of the fully-depleted type NAND flash memory. The fully-depleted NAND flash memory of this embodiment is the same as the fully-depleted NAND flash memory of the second embodiment, except that only the source region 7 and the drain region 8 are lifted up. More specifically, the upper faces of the source region 7 and the drain region 8 are located closer to the respective gate insulating films 2 than to the interface between the SOI layer 1c and the semiconductor layer 22. The height of the upper faces should preferably be twice or more the thickness of the semiconductor layer 22. This structure can be obtained by growing Si or Ge only on the source region 7 and the drain region 8 by the selective epitaxial growth technique, after the structure of the second embodiment is produced.

This embodiment can also achieve the same effects as the second embodiment.

Fifth Embodiment

Figure 6:
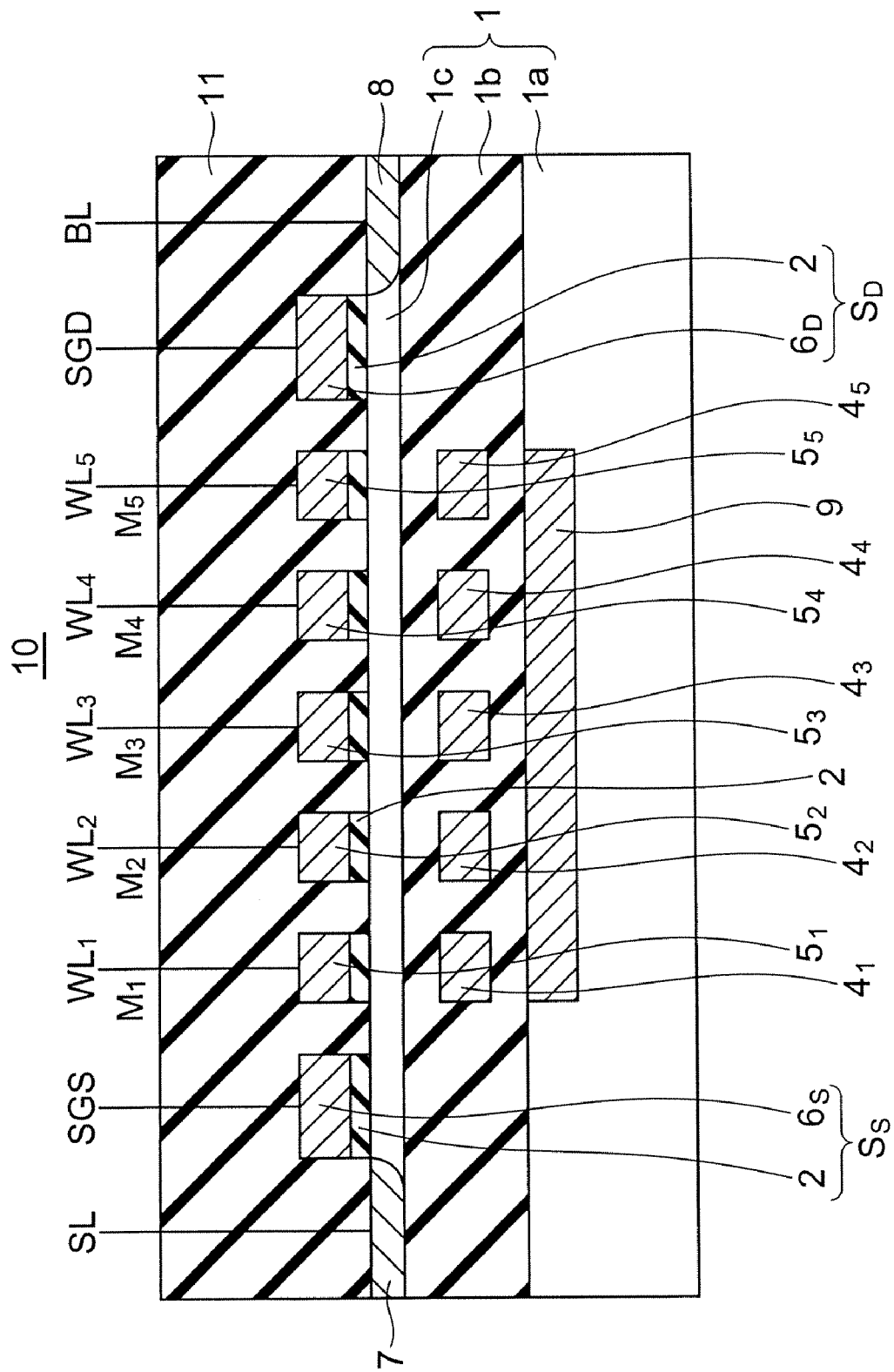
FIG. 6 is a cross-sectional view of the nonvolatile semiconductor memory device in accordance with a fifth embodiment.

Next, a nonvolatile semiconductor memory device in accordance with a fifth embodiment of the present invention is described. The nonvolatile semiconductor memory device of this embodiment is a NAND flash memory of a fully depleted type. FIG. 6 is a cross-sectional view of the fully-depleted NAND flash memory. The fully-depleted NAND flash memory of this embodiment is the same as the fully-depleted NAND flash memory of the first embodiment shown in FIG. 1, except that the insulating film 3 of each of the memory cells $M_i$ (i=1, 2, . . . , 5) of each NAND cell is removed, the floating gates $4_i$ are provided in a buried insulating film 1*b* so that the channel region 1*c* and the gate insulating films 2 are interposed between the floating gates 4$_i$ and the control gates 6$_i$, and a control gate 9 is provided on the opposite face of the buried insulating film 1*b* from the SOI layer 1*c*. The control gate 9 is a common control gate among the memory cells M$_1$, M$_2$, M$_3$, M$_4$, and M$_5$. An insulating film is formed between each floating gate 4$_i$ and the SOI layer 1*c*.

In this embodiment, a write operation and an erase operation are performed in the following manner.

In a write operation, the source region 7 and the drain region 8 are grounded, and a positive bias is applied to the gates 6$_S$ and 6$_D$ of the select gate transistors S$_S$ and S$_D$ and the control gate 5$_i$ of each memory cell M$_i$ (i=1, 2, . . . , 5), so as to form an n-type inversion layer in the channel region 1*c*. While the bias of the control gate 5$_1$ of the memory cell M$_1$ on which writing is to be performed is maintained, a negative bias is applied to the control gates 5$_2$, 5$_3$, 5$_4$, and 5$_5$ of the memory cells M$_2$, M$_3$, M$_4$, and M$_5$ on which writing is not to be performed. In this manner, electrons remain only in the channel region 1*c* of the memory cell M$_1$, for example, on which writing is to be performed. A large positive bias is then applied to the control gate 9, so that electrons are injected to the floating gate.

In an erase operation, the drain region 8 to which the opposite bias from the bias applied in the write operation is applied is grounded, and a negative bias is applied to the gates 6$_S$ and 6$_D$ of the select gate transistors S$_S$ and S$_D$ and the control gate 5$_i$ of each memory cell M$_i$ (i=1, 2, . . . , 5), so as to form a p-type inversion layer in the channel region 1*c*. A large negative bias is then applied to the control gate of the memory cell (the control gate 5$_3$ of the memory cell M$_3$, for example) on which erasing is to be performed, and holes are injected to the floating gate 4$_3$. Here, a positive bias may be applied to the control gates 5$_1$, 5$_2$, 5$_4$, and 5$_5$ of the memory cells M$_1$, M$_2$, M$_4$, and M$_5$ on which erasing is not to be performed.

In this embodiment, a different erasing operation from the above can be performed. More specifically, the source region 7 and the drain region 8 are grounded, and a positive bias is applied to the gates 6$_S$ and 6$_D$ of the select gate transistors S$_S$ and S$_D$ and the control gate 5$_i$ of each memory cell M$_i$ (i=1, 2, . . . , 5), so as to form an n-type inversion layer in the channel region 1*c*. A large negative bias is then applied to the control gate, so as to pull the negative charges out of the floating gates 4$_i$. By doing so, the information stored in desired cells connected to one bit line can be collectively erased. In such an erasing operation, holes do not need to be injected. Accordingly, a drain region formed with an n$^+$-type impurity diffusion layer, instead of a drain region formed with a metal electrode, can be used.

Like the first embodiment, this embodiment can provide a memory device that can be made very small in size and have a high capacity while being able to effectively suppress short-channel effects.

As in the second embodiment shown in FIG. 3, the NAND cells 10 may be formed on the semiconductor layer 22 that is formed so that the insulating film 21 is interposed between the semiconductor substrate 20 and the semiconductor layer 22, and the select gate transistors S$_S$ and S$_D$, the source region 7, and the drain region 8 may be formed on the semiconductor substrate 20 in this embodiment.

Referring now to FIGS. 7 through 10, a specific example of a method for manufacturing the fully-depleted NAND flash memory of this embodiment is described.

Figure 7:
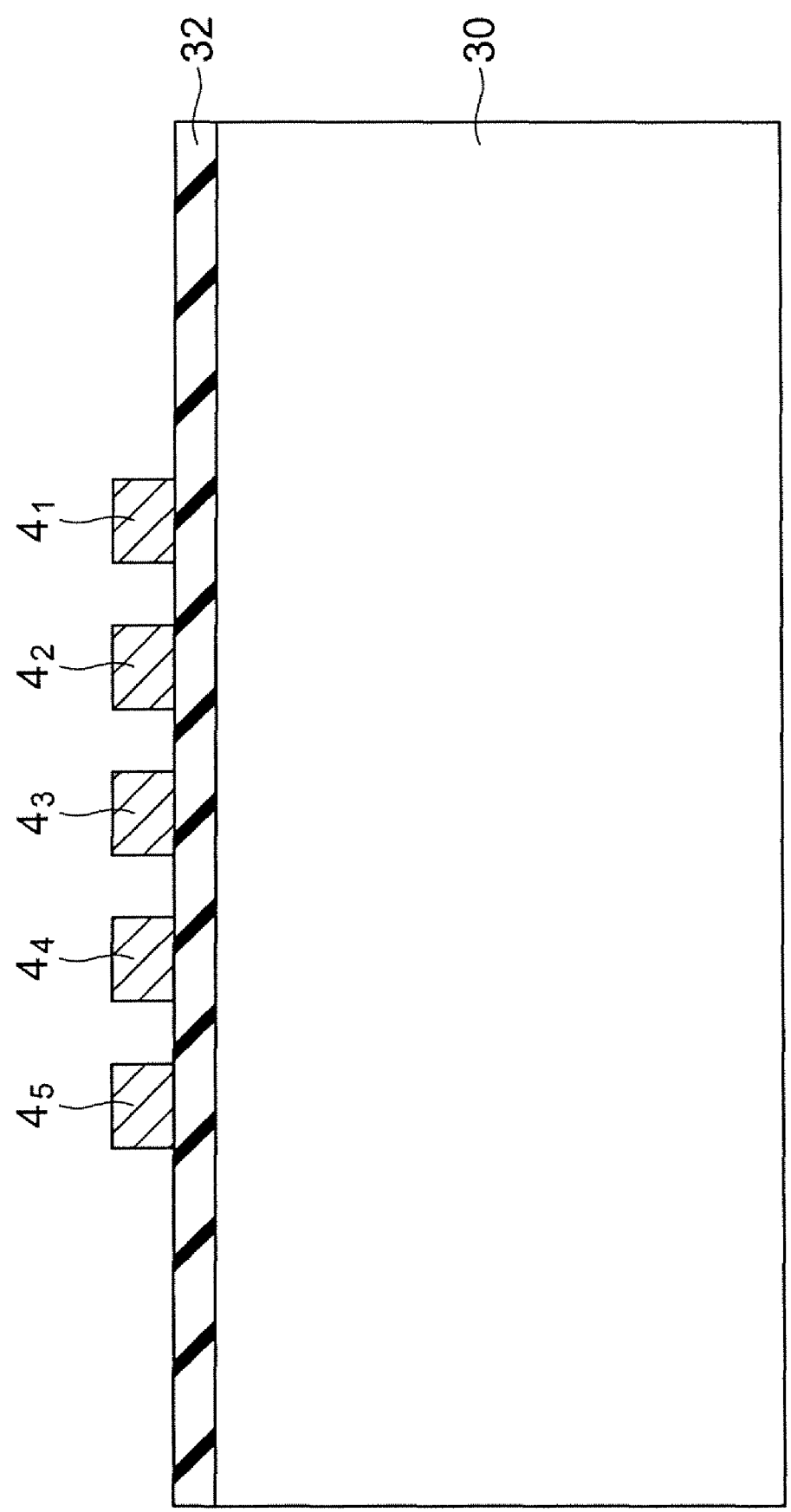
FIGS. 7 through 10 are cross-sectional views illustrating steps for manufacturing the nonvolatile semiconductor memory device in accordance with the fifth embodiment.

As shown in FIG. 7, after a thermal oxide film 32 of approximately 10 nm is formed on a Si substrate 30, a phosphorus-doped polysilicon film or the like is deposited by CVD (Chemical Vapor Deposition) or the like, and is patterned by a known lithography technique. In this manner, the floating gates 4$_i$ (i=1, 2, . . . , 5) are formed.

Figure 8:
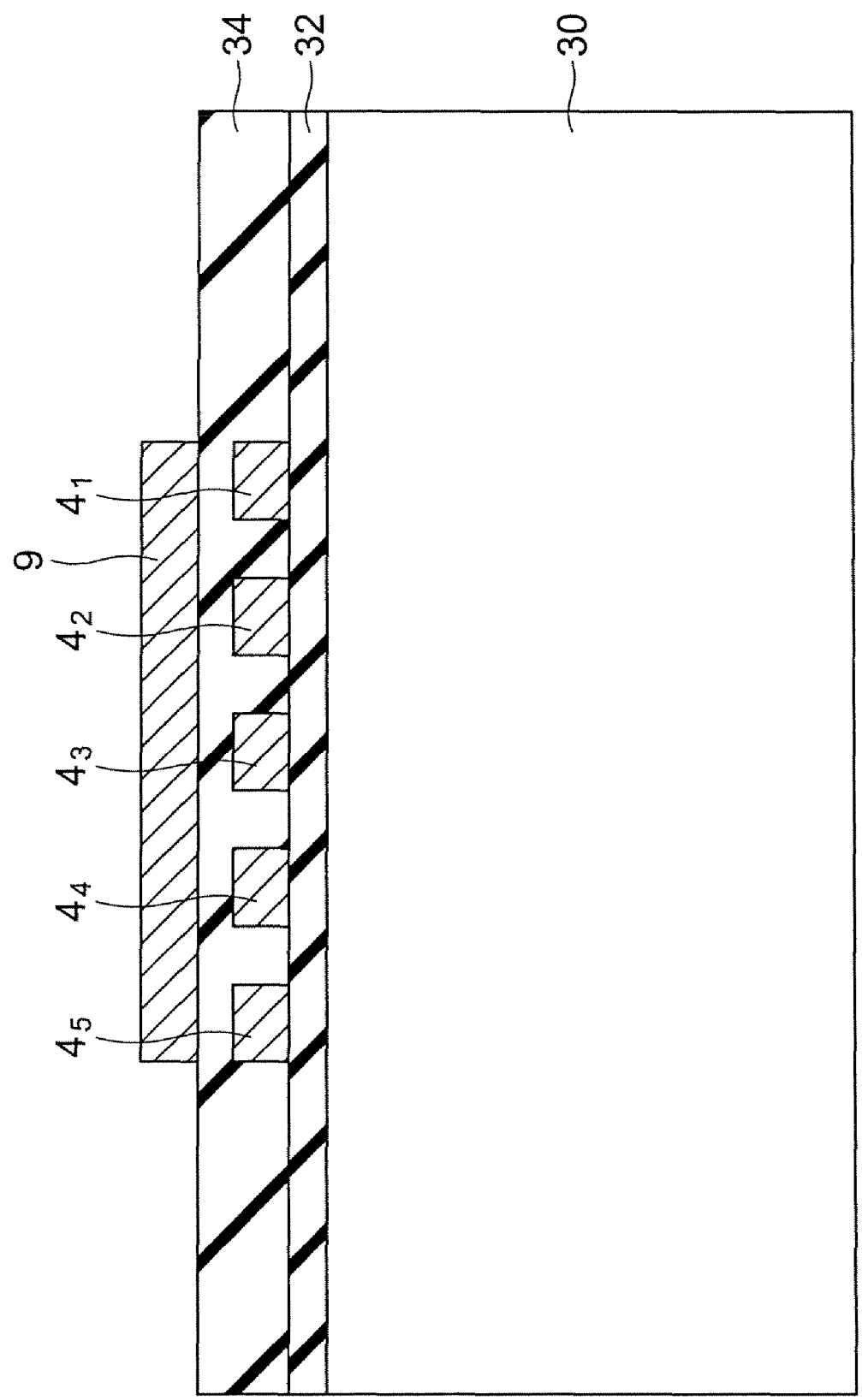

As shown in FIG. 8, an insulating film 34 made of TEOS, for example, is deposited by CVD, so as to bury the patterned floating gates 4$_i$ (i=1, 2, . . . , 5). After the upper face of the insulating film 34 is flattened by CMP (Chemical Mechanical Polishing) or the like, a phosphorus-doped polysilicon film is again deposited by CVD and is patterned, so as to form the control gate 9.

Figure 9:
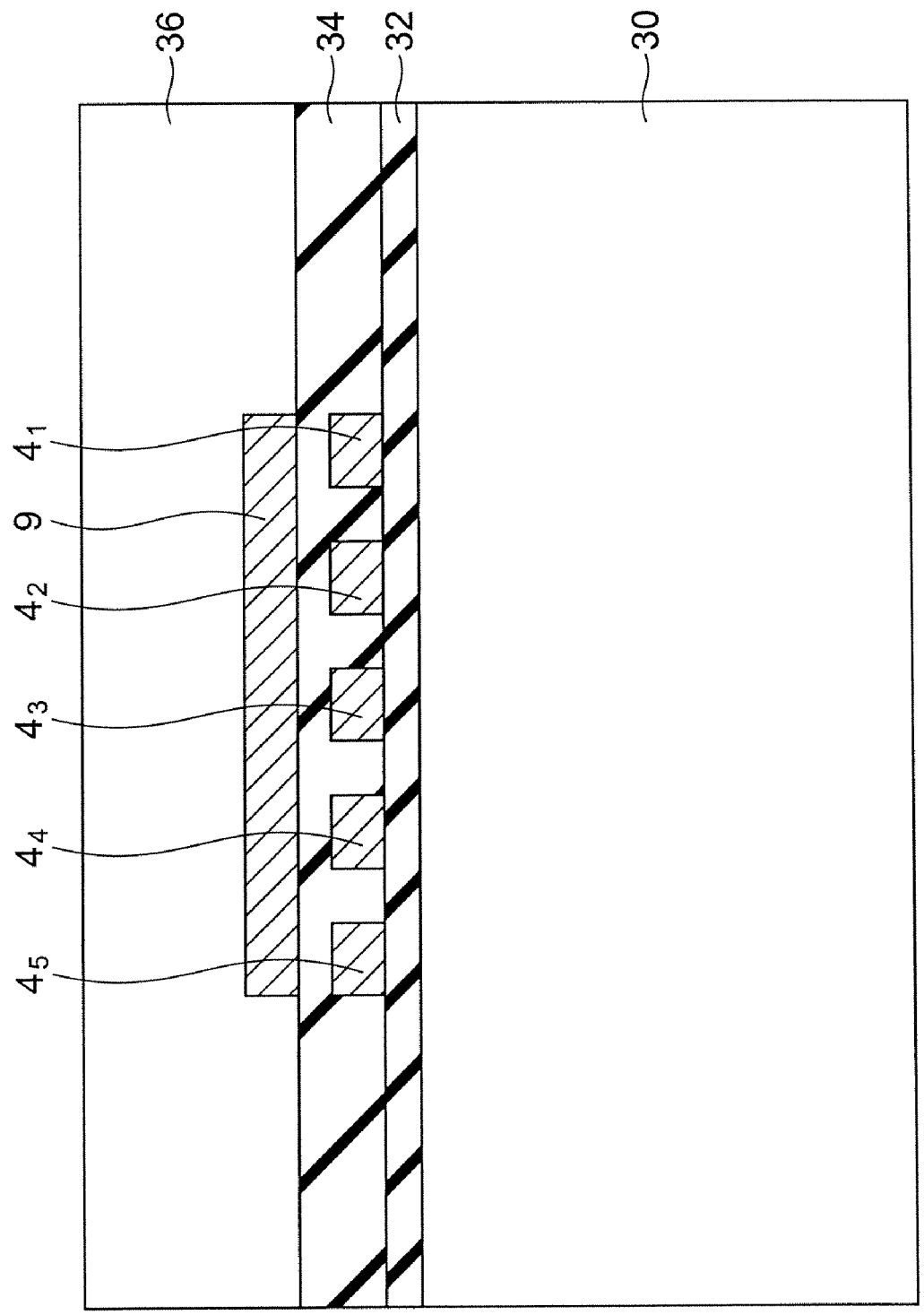

As shown in FIG. 9, after a Si film 36 is deposited by CVD, the upper face of the Si film 36 is flattened by CMP or the like, if necessary.

Figure 10:
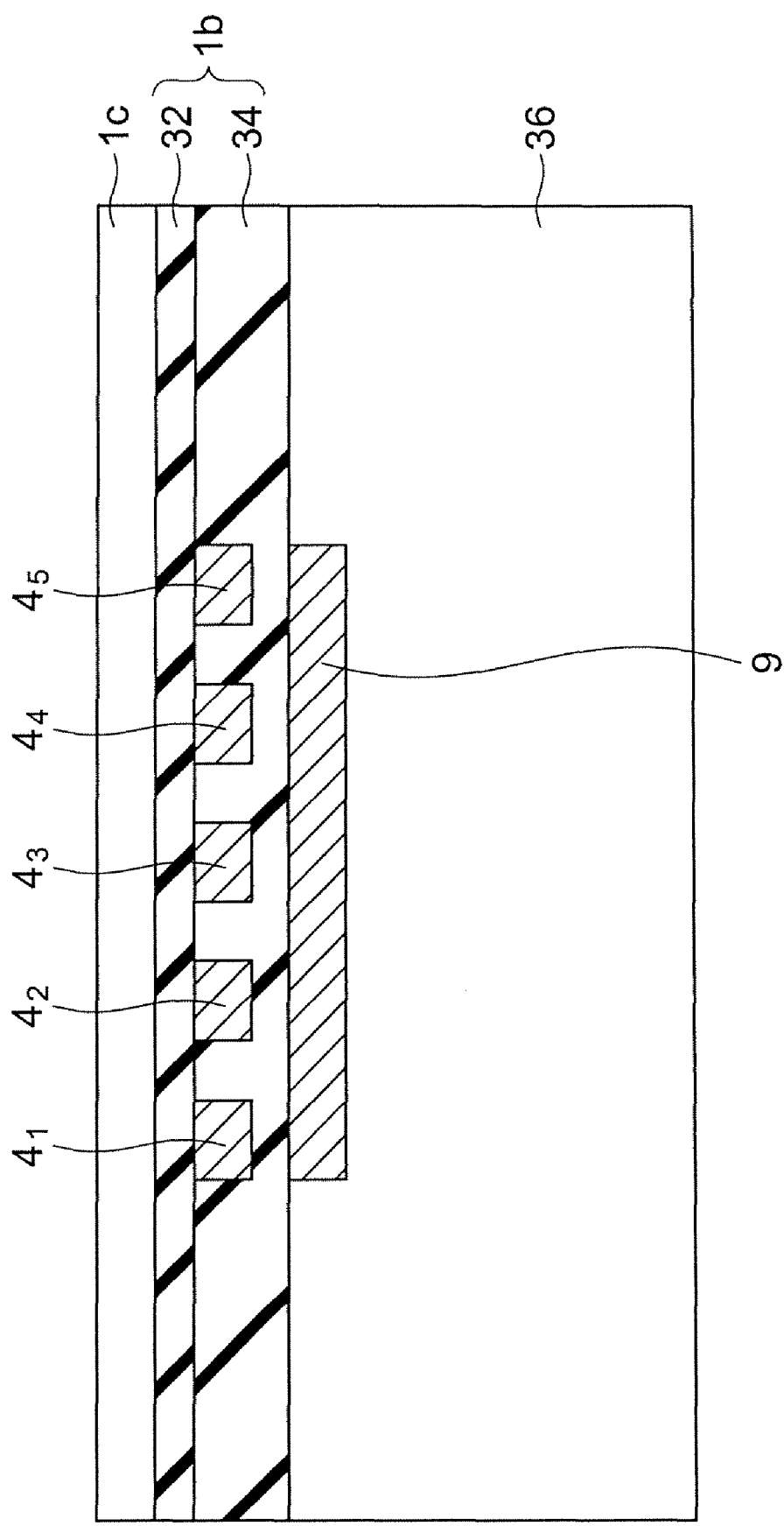

H$^+$ ions or the likes are implanted into the Si film 36, and heat treatment is carried out. The structure is then flipped upside down, and the upper face of the Si substrate 30 is flattened by CMP or the like, so as to form the SOI layer 1*c*. As a result, the structure shown in FIG. 10 is obtained. In this structure, the insulating film 32 and the insulating film 34 become the insulating film 1*b*. Thereafter, the gate insulating film 2, the floating gates 4$_1$ through 4$_5$, the source region 7, the drain region 8, and the likes are produced by a known method, so as to complete the structure shown in FIG. 6.

Sixth Embodiment

Figure 11:
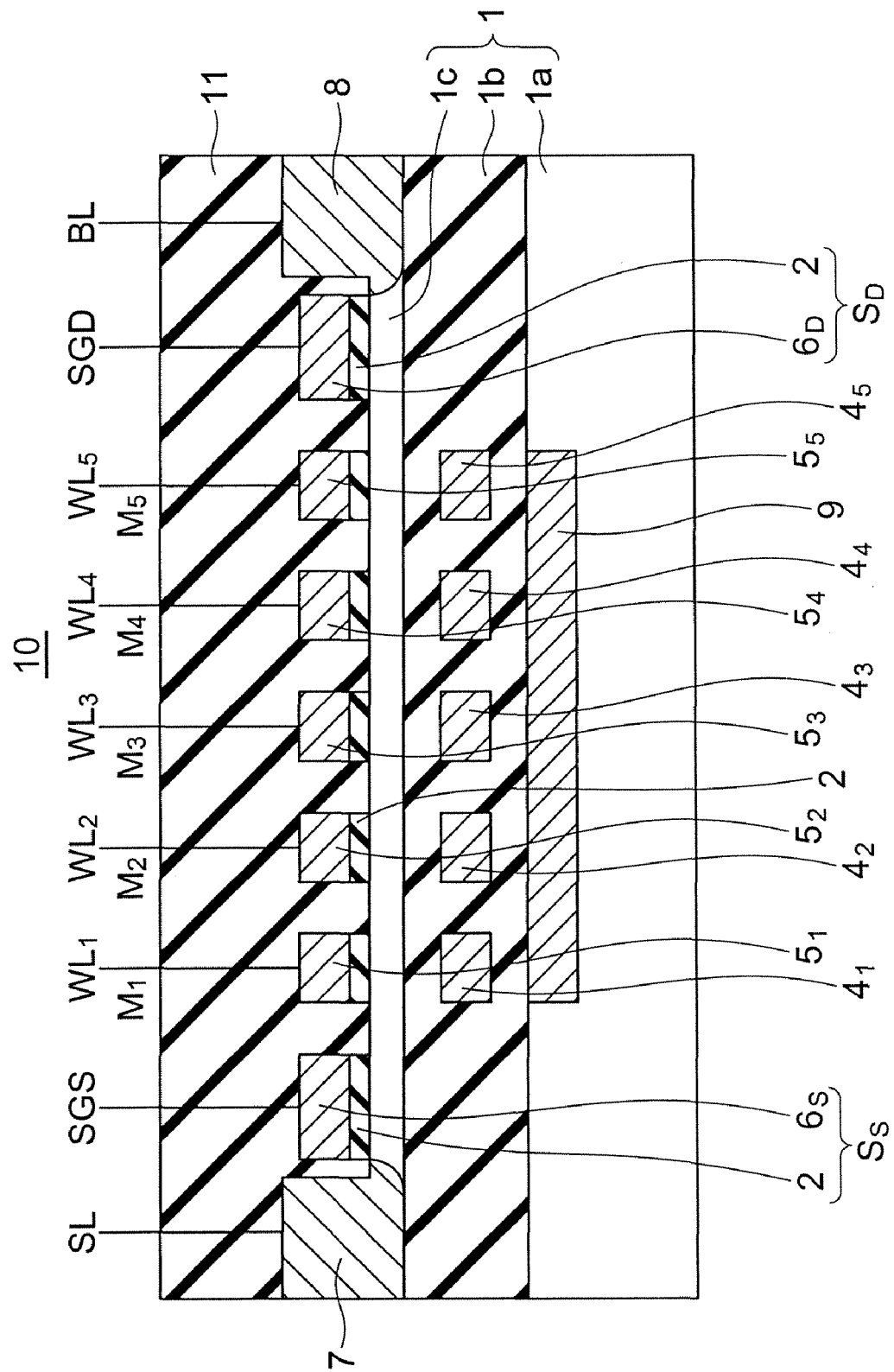
FIG. 11 is a cross-sectional view of the nonvolatile semiconductor memory device in accordance with a sixth embodiment.

Next, a nonvolatile semiconductor memory device in accordance with a sixth embodiment of the present invention is described. The nonvolatile semiconductor memory device of this embodiment is a NAND flash memory of a fully depleted type. FIG. 11 is a cross-sectional view of the nonvolatile semiconductor memory device of this embodiment. The fully-depleted NAND flash memory of this embodiment is the same as the fully-depleted NAND flash memory of the fifth embodiment shown in FIG. 6, except that only the source region 7 and the drain region 8 are lifted up. More specifically, the upper faces of the source region 7 and the drain region 8 are located closer to the respective gate insulating films 2 than to the respective interfaces between the SOI layer 1*c* and the gate insulating films 2. The height of the upper faces should preferably be twice or more the thickness of the SOI layer 1*c*. This structure can be obtained by growing Si or Ge only on the source region 7 and the drain region 8 by the selective epitaxial growth technique, after the structure of the fifth embodiment is produced. With this structure, the source/drain parasitic resistance of the select gate transistors can be more efficiently reduced than in the fifth embodiment.

Like the fifth embodiment, this embodiment can also provide a memory device that can be made very small in size and have a high capacity while being able to effectively suppress short-channel effects.

Seventh Embodiment

Figure 12:
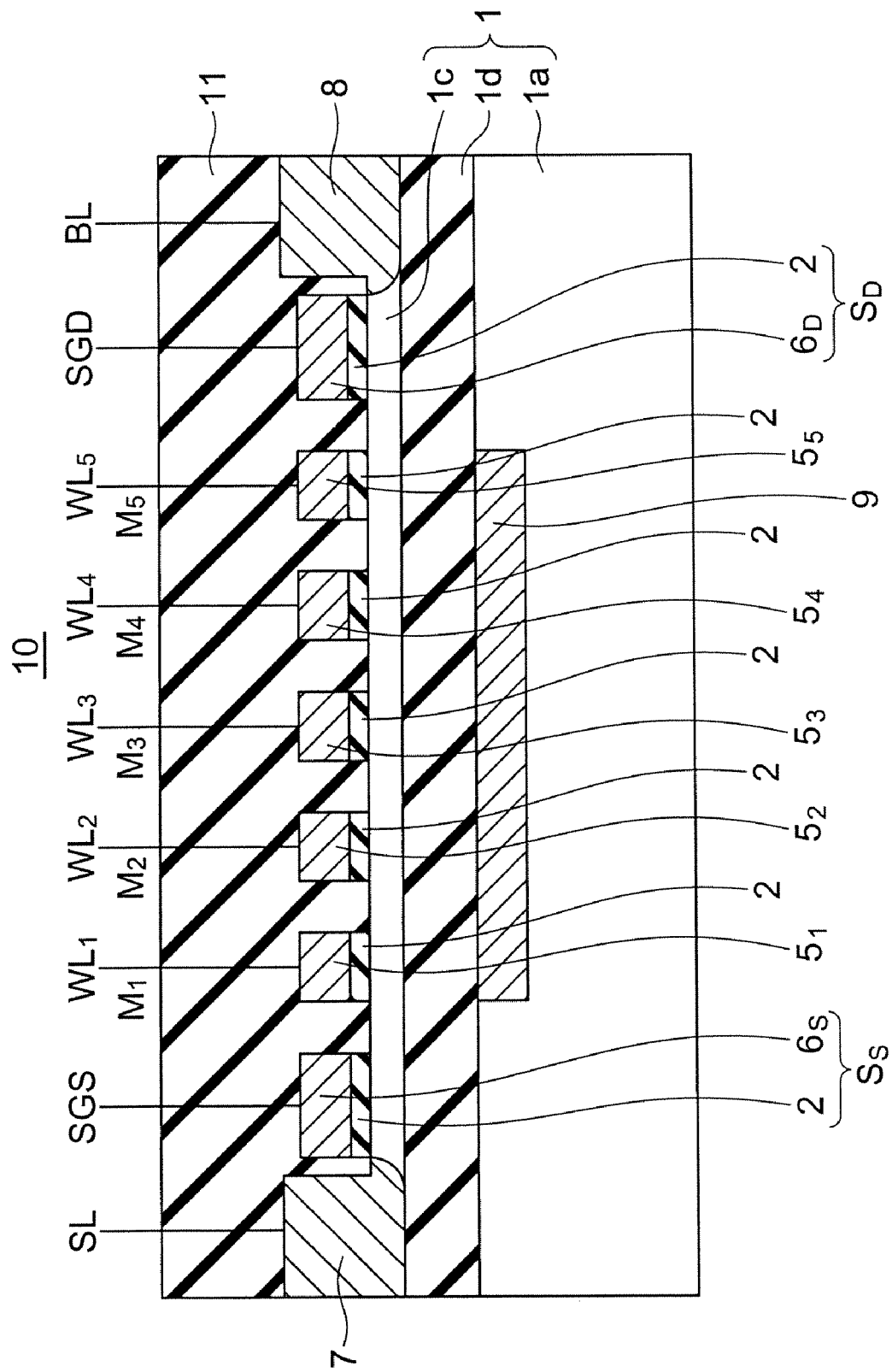
FIG. 12 is a cross-sectional view of the nonvolatile semiconductor memory device in accordance with a seventh embodiment.

Next, a nonvolatile semiconductor memory device in accordance with a seventh embodiment of the present invention is described. The nonvolatile semiconductor memory device of this embodiment is a NAND flash memory of a fully depleted type. FIG. 12 is a cross-sectional view of the nonvolatile semiconductor memory device of this embodiment. The fully-depleted NAND flash memory of this embodiment is the same as the fully-depleted NAND flash memory of the sixth embodiment shown in FIG. 11, except that a charge storing insulating film 1*d* is used in place of the buried insulating film 1*b* and the floating gates 4$_1$, 4$_2$, 4$_3$, 4$_4$, and 4$_5$. The charge storing insulating film 1*d* may be a stacked film having insulating films sandwiching a charge trapping film, such as $SiO_2/Si_3N_4/SiO_2$ or $SiO_2/Al_2O_3/SiO_2$, or an oxide film having Si nanodots diffused therein.

For such a structure, known SOI substrate manufacturing techniques can be readily applied. Accordingly, the manufacturing becomes even easier.

The writing, reading, and erasing operations in accordance with this embodiment are the same as those in accordance with the fifth embodiment. Also, as in the modification of the fifth embodiment, a drain formed with an $n^+$-type impurity diffusion layer, instead of a drain formed with a metal electrode, may be used in a case where an erasing operation that does not involve hole tunneling is performed.

Like the fifth embodiment, this embodiment can provide a memory device that can be made very small in size and have a high capacity to effectively suppress short-channel effects.

In each of the first through seventh embodiments, short-channel effects are suppressed by putting the channel into a fully depleted state. Accordingly, the film thickness of the SOI layer is half the gate length at a maximum, and preferably, is 1/3 to 1/4 of the gate length.

As described above, each embodiment of the present invention can provide a memory device that can be made very small in size and have a high capacity while being able to effectively suppress short-channel effects.

Also, since a Schottky electrode can provide both electrons and holes into the channel, writing, reading, and erasing operations can be performed with a combination of such a Schottky electrode and a fully-depleted channel, without source/drain regions between cells.

As described above, in accordance with each embodiment of the present invention, a nonvolatile semiconductor memory device that can be made very small in size and have a high capacity can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory device comprising:
    a first insulating film formed on a semiconductor substrate;
    a semiconductor layer formed on the first insulating film;
    a NAND cell having a plurality of memory cell transistors connected in series, each of the memory cell transistors having a gate insulating film formed on the semiconductor layer, a charge storing layer formed on the gate insulating film, a second insulating film formed on the charge storing layer, and a control gate formed on the second insulating film;
    a source region having an impurity diffusion layer formed in one side of the NAND cell, the source region being formed in the semiconductor substrate;
    a drain region having a metal electrode formed in the other side of the NAND cell, the drain region being formed in the semiconductor substrate;
    a first select gate transistor formed in a first portion of the semiconductor substrate, the first portion being located between the one end of the NAND cell and the source region; and
    a second select gate transistor formed in a second portion of the semiconductor substrate, the second portion being located between the other end of the NAND cell and the drain region.

2. The memory device according to claim 1, wherein the source region and the drain region have upper faces that are located closer to the gate insulating film than to an interface between the semiconductor layer and the gate insulating film.

3. The memory device according to claim 2, wherein the height from lower faces to the upper faces of the source region and the drain region is twice or more the thickness of the semiconductor layer.

4. The memory device according to claim 1, wherein the charge storing layer is a floating gate.

5. A nonvolatile semiconductor memory device comprising:
    a first insulating film formed on a semiconductor substrate;
    a semiconductor layer formed on the first insulating film;
    a NAND cell having a plurality of memory cell transistors connected in series, each of the memory cell transistors having a gate insulating film formed on the semiconductor layer, a control gate formed on the gate insulating film, and a charge storing layer formed in the first insulating film so as to face the control gate;
    a common control gate formed between the semiconductor substrate and the first insulating film so as to face the NAND cell;
    a source region formed in one side of the NAND cell; and
    a drain region formed in the other side of the NAND cell.

6. The memory device according to claim 5, wherein:
    the source region and the drain region are formed in the semiconductor layer; and
    the memory device further comprises:
    a first select gate transistor formed in a first portion of the semiconductor layer, the first portion being located between the one end of the NAND cell and the source region; and
    a second select gate transistor formed in a second portion of the semiconductor layer, the second portion being located between the other end of the NAND cell and the drain region.

7. The memory device according to claim 6, wherein the source region and the drain region have upper faces that are located closer to the gate insulating film than to an interface between the semiconductor layer and the gate insulating film.

8. The memory device according to claim 7, wherein the height from lower faces to the upper faces of the source region and the drain region is twice or more the thickness of the semiconductor layer.

9. The memory device according to claim 5, wherein:
    the source region and the drain region are formed in the semiconductor substrate; and
    the memory device further comprises:
    a first select gate transistor formed in a first portion of the semiconductor substrate, the first portion being located between the one end of the NAND cell and the source region; and
    a second select gate transistor formed in a second portion of the semiconductor substrate, the second portion being located between the other end of the NAND cell and the drain region.

10. The memory device according to claim 9, wherein the source region and the drain region have upper faces that are located closer to the gate insulating film than to an interface between the semiconductor layer and the gate insulating film.

11. The memory device according to claim 10, wherein the height from lower faces to the upper faces of the source region and the drain region is twice or more the thickness of the semiconductor layer.

12. The memory device according to claim 5, wherein the source region is an impurity diffusion layer, and the drain region is a metal electrode.

13. The memory device according to claim 5, wherein the source region and the drain region are impurity diffusion layers.

14. The memory device according to claim 5, wherein the charge storing layer is a floating gate.

* * * * *